United States Patent [19]

Dunaway et al.

[11] Patent Number: 4,528,446
[45] Date of Patent: Jul. 9, 1985

[54] OPTOELECTRONIC LENS ARRAY WITH AN INTEGRATED CIRCUIT

[75] Inventors: Thomas J. Dunaway, Minneapolis; Richard K. Spielberger, Maple Grove, both of Minn.; John C. Wittenberger, Littleton, Colo.

[73] Assignee: Honeywell Inc., Minneapolis, Minn.

[21] Appl. No.: 393,963

[22] Filed: Jun. 30, 1982

[51] Int. Cl.³ .............................................. H01J 3/14
[52] U.S. Cl. ...................................... 250/216; 250/578
[58] Field of Search .................. 250/216, 578, 211 R, 250/211 J; 357/30, 31, 32; 350/441, 483; 156/99

[56] References Cited

U.S. PATENT DOCUMENTS

| 3,239,675 | 3/1966 | Morey et al. | 250/216 |
| 3,368,078 | 2/1968 | Flint et al. | 250/216 |
| 3,400,276 | 9/1968 | Zinn | 250/211 R |
| 4,058,821 | 11/1977 | Miyoshi et al. | 357/19 |
| 4,425,501 | 1/1984 | Stauffer | 250/216 |

Primary Examiner—David C. Nelms
Attorney, Agent, or Firm—Theodore F. Neils

[57] ABSTRACT

Lens arrangements for integrated circuits having a plurality of optical transducers is provided. A method for prefabricating such an arrangement is also disclosed.

22 Claims, 9 Drawing Figures

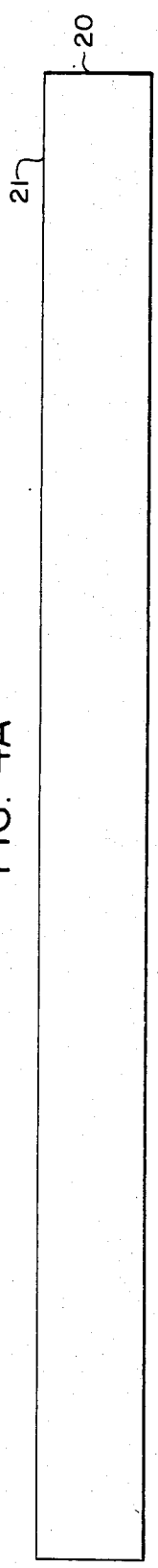
FIG. 4A
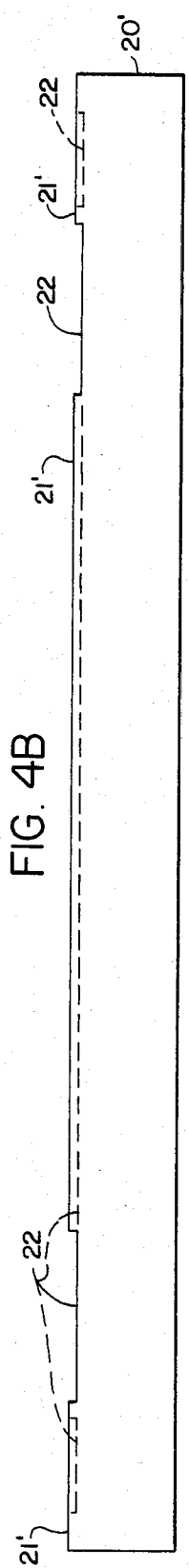
FIG. 4B
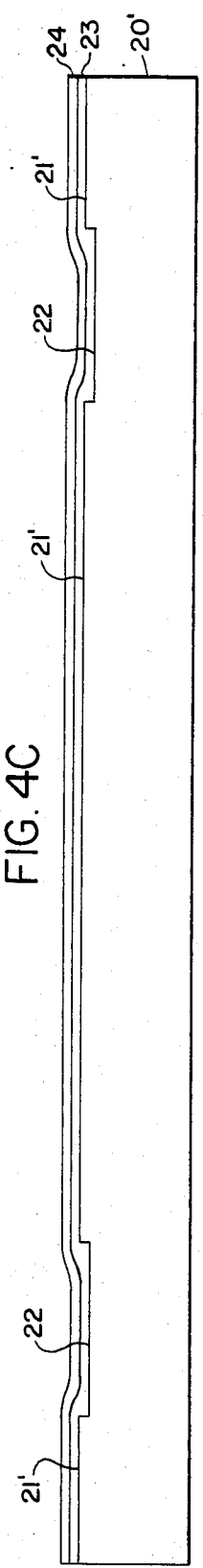
FIG. 4C
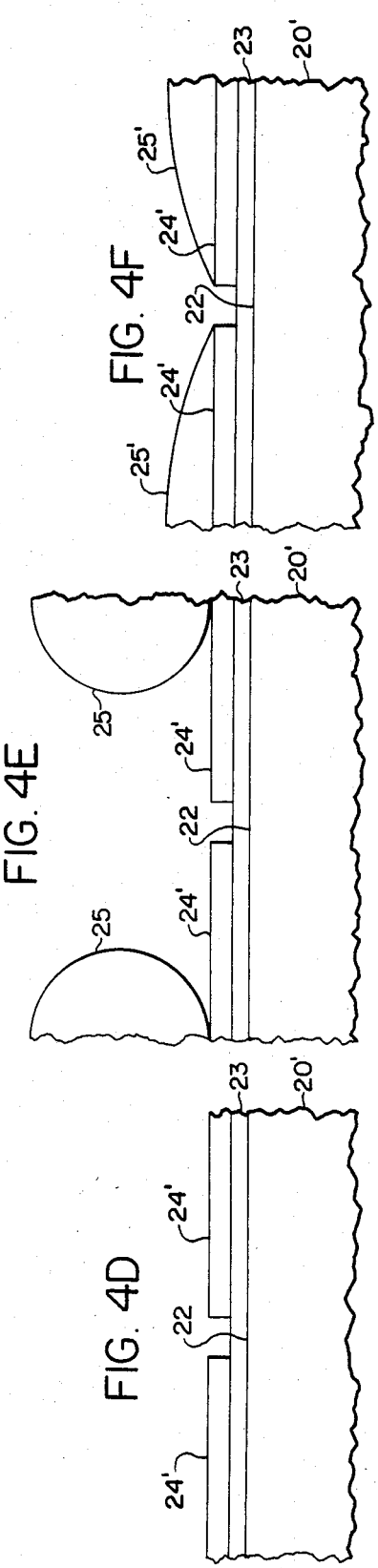
FIG. 4D
FIG. 4E
FIG. 4F

OPTOELECTRONIC LENS ARRAY WITH AN INTEGRATED CIRCUIT

BACKGROUND OF THE INVENTION

This invention relates to lens systems for optoelectronic transducers.

In some optoelectronic device situations, an array of optoelectronic transducers is required. Further, in some of these situations, a lens must be provided for each of these optoelectronic transducing devices to properly direct the transmitted electromagnetic radiation interacting with these devices.

These optoelectronic transducers typically have structural features which are usually on the order of microns, and almost always less than a mil. There are substantial difficulties in providing similarly sized lenses of good quality. Such lenses usually require techniques different from those used in providing ordinary lenses. One such technique is to take a previously formed glass sphere and mechanically position and hold the sphere adjacent to the transducer such that the sphere itself serves as a lens. Another technique is to fabricate a lens right on the transducer itself, as shown in U.S. Pat. No. 4,058,821 to Miyoshi, et al. This reference shows the placing of a selected amount of glass on a portion of a material layer already provided over a semiconductor photodetector and then heating the selected amount of glass to its melting temperature. This glass, after melting, flows over the material layer and, through surface tension, takes the shape of a lens which it maintains after cooling below the melting temperature. However, raising the amount of glass to its melting temperature also requires heating the semiconductor device which may be detrimental to the structures, including those forming circuit components, contained therein. Further, making several lenses for each chip, and doing so for chip after chip, can be prohibitive in large volumes.

SUMMARY OF THE INVENTION

The present invention provides a lens arrangement bonded to an integrated circuit such that the lens arrangement has portions thereof serving as a plurality of lenses (lenslets) each of which is capable of directing electromagnetic radiation transmitted therethrough along a desired path with respect to the associated optoelectronic device in the integrated circuit. The lens arrangement may also have means therein for spacing other components in the optical system with respect thereto, and may be bonded using a substantially transparent adhesive between the lens arrangement and the integrated circuit.

The joining of the lens arrangement to the integrated circuit by bonding can be based on the lens arrangement being previously fabricated by molding. The mold can be made from a prepared structure which simulates the shape desired for the lens arrangement including the lens portions thereof.

BRIEF DESCRIPTION OF THE DRAWINGS

FIGS. 4A, 4B, 4C, 4D, 4E and 4F show the steps in providing a master surface upon which a mold is based for forming the lenslet block shown in FIGS. 1 and 2.

DESCRIPTION OF THE PREFERRED EMBODIMENTS

Figure 1:
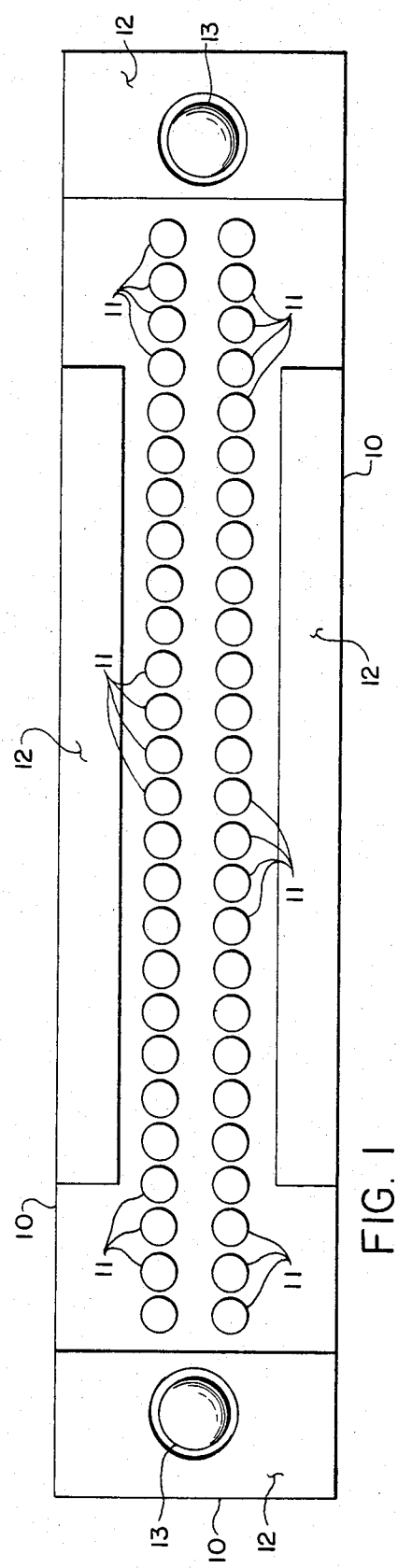
FIG. 1 shows a plan view of a lenslet block.

FIG. 1 shows a lens means which can be used to provide at least a portion of an optical system situated in an optical path leading to an integrated circuit system having either photodetectors or photoemitters therein. The lens means of FIG. 1 is a molded block, 10, of a suitable optical quality material for lenses, such as polymethylmethacrylate or polycarbonate. Block 10 has a suitably contoured surface on the side opposite the one seen in FIG. 1 for joining with a complementary contoured surface in, or in part of, such an integrated circuit system. The side of block 10 viewed in FIG. 1 shows two parallel rows of lenslets, 11. Lenslets 11 are of such a nature that if cross sections of the lenslets themselves were shown, they would reveal substantially the sector of the circle as the lenslet cross-sectional plane figure. Raised surfaces, 12, are examples of spacing means formed integrally in block 10 to serve as standoffs for properly spacing other optical system components with respect to lenslets 11 such as an aperture means. The circular structures, 13, at either end of block 10 are shown as examples of fastening means formed integrally in block 10 such as aperture posts as part of the arrangement used for fastening such an aperture means to block 10.

Where block 10 is used with a monolithic integrated circuit as a part of an optical system having dimensions of the same order as those typically encountered in monolithic integrated circuits. Dimensions of block 10 of approximately 265 mils×50 mils would be typical to encompass an elongated array of electromagnetic radiation sensitive transducers. There, for instance, could be photodetectors which would also be made in two parallel rows such that the lenslets, for the most part, would each have their optical axes approximately centered on a corresponding photodetector. The lenslets, themselves, have a typical diameter in the view of FIG. 1 of approximately 180 $\mu$m and are such that the center height of the highest point on a lenslet from the major surface below is typically 22 $\mu$m. Whatever is desired as focal lengths for these lenslets, and desired as sizes of the photodetectors, controls the choice of these dimensions. The raised surfaces 12, used as aperture standoffs, might typically have a height to the upper surface above the major surface below of approximately 15 $\mu$m. Aperture posts 13 may typically have a structure which reached the height of 9 mils above the major surface of block 10 shown in FIG. 1.

The use of a lens means such as block 10 of FIG. 1 bonded to a monolithic integrated circuit, as opposed to forming the lenslets directly on the monolithic integrated circuit, avoids the heating of the optical material for such lenslets in the vicinity of the monolithic integrated circuit. The innevitable result of also heating that monolithic integrated circuit is then eliminated. For many suitable optical materials which can be formed directly on a monolithic integrated circuit, the materials melt at temperatures which are very substantial fraction of the diffusion temperatures of dopants used in the monolithic integrated circuit. This could lead to certain additional diffusions which could damage, or change the characteristics of, the monolithic integrated circuit.

Further, heating is a relatively slow process, while bonding can be done relatively quickly. The curing time for the adhesive used in the bonding does not add much time to the bonding process insofar as delaying beginning bonding of the next lenslet to the next monolithic integrated circuit when compared with the solidifying time for molten lens material. Also, the repeatability of structural configuration may be easier to maintain bonding a molded lens each time a lens-circuit unit is made when compared with constructing a new lens for each such unit.

Figure 2:
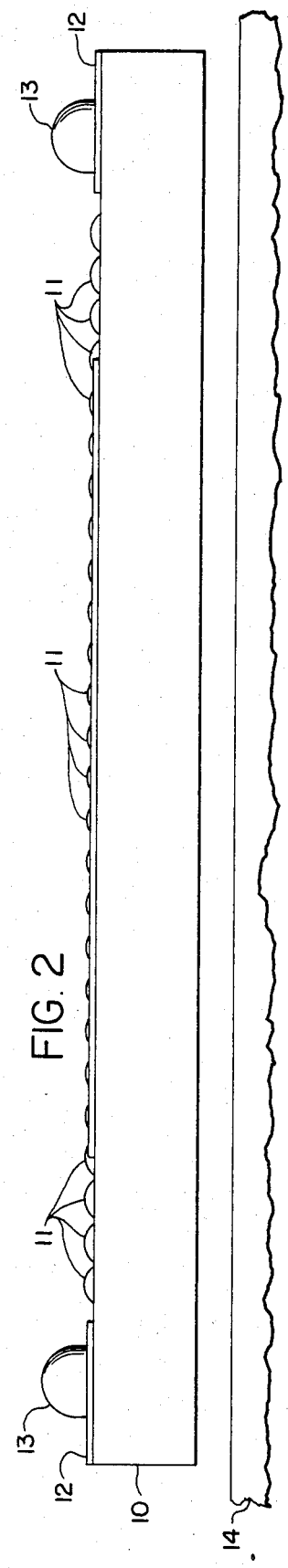
FIG. 2 shows a side view of the lenslet block of FIG. 1 and a side view of a portion of a monolithic integrated circuit chip.

FIG. 2 shows a side view of block 10 and shows it positioned above a portion of a monolithic integrated circuit chip, 14, prior to bonding the two together. The monolithic integrated circuit chip is accurately bonded in a selected position on a ceramic substrate (not shown) using an epoxy resin adhesive where such ceramic material substrate is part of a ceramic monolithic integrated circuit housing. The accuracy of the position of the chip with respect to the other geometrical features of the housing may need to be within two mils of the desired position and may require using an optical comparator and micromanipulator to achieve such accuracy. The epoxy adhesive is cured with the chip in the selected position, and thereafter, interconnections are made between the ceramic housing external connector conductors and the contact pads in the monolithic integrated circuit chip using, for instance, well known thermal compression bonding techniques.

Next, block 10 is bonded to monolithic integrated circuit chip 14 typically with a requirement on the tolerance of positioning of no more than approximately 2 $\mu$m from the desired position. To accomplish this, a well known machine for use in fabricating monolithic integrated circuits, an optical aligner, can be used with a micromanipulator. The use of the optical aligner containing an ultravoilet radiation source is particularly efficient because the use of an adhesive which cures under ultraviolet radiation becomes feasible for making the bond during the time the optical aligner is holding the monolithic integrated circuit chip and lens block 10 in a selected position relative to one another.

A positioner is used to hold the ceramic substrate with the monolithic integrated circuit chip bonded thereto against selected datums so that chip is held in parallel and in line with the optical aligner optics. An adhesive which can be cured by exposure to ultraviolet radiation is applied to the chip at the location in which lens block 10 is to be bonded, a suitable adhesive being Loctite LD580.

Lens block 10 is placed on the chip under a separate microscope in close proximity to the final desired position, and then the substrate with the chip bonded thereto and the lens thereon is placed in the positioner and in the optical aligner and locked in place in the micromanipulator. The nest with the substrate assembly is put in a position where the four probes of the micromanipulator can manipulate the position of the nest.

The micromanipulator manipulates the nest to a position where further probes can make contact with lens block 10. These further probes are provided as two sets independent of one another and with one set of probes at each end of lens block 10. The probes within a set are independent of one another to a certain degree to allow for small differences of thickness or parallelism in lens block 10. These probes are such that they make contact with block 10 at approximately a 30 degree angle with respect to the lens block 10 ends and they have an adjustable load spring so that they can be adjusted to hold lens block 10 stationary and to facilitate removing bubbles in the adhesive.

These further probes are then brought against, and locked in position with, lens block 10 to hold it in a stationary position while the micromanipulator moves the nest with the substrate chip assembly sufficiently to have the lens block 10 properly aligned with chip 14. When this alignment is accomplished, lens block 10 is held in the selected position with respect to the nest with the substrate and chip therein until the ultraviolet source within the optical aligner has partially cured the adhesive which typically takes up to approximately two minutes. Thereafter, the ceramic substrate with chip 14 bonded thereto which chip, in turn, supports lens block 10 bonded thereto, is removed from the optical aligner and put under another ultraviolet source for providing the final curing of the adhesive. This final curing typically takes ten minutes to half an hour.

Figure 3:
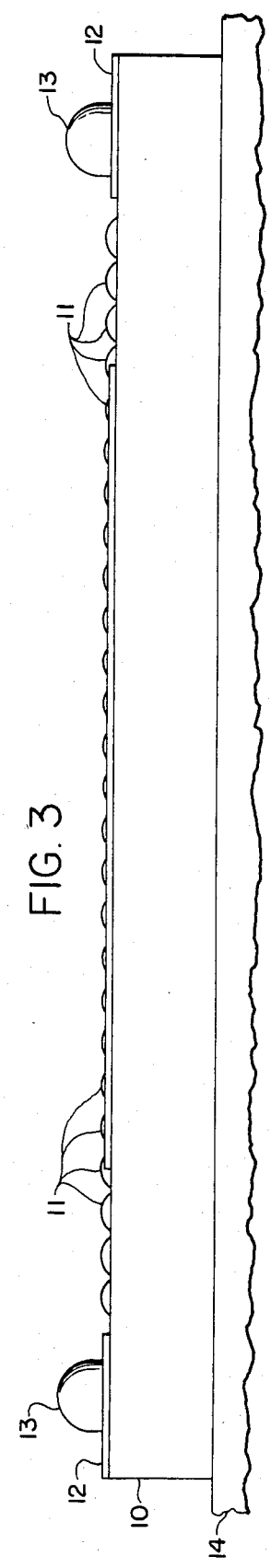
FIG. 3 shows a side view of the items of FIG. 2 joined together.

The result of these operations is shown in FIG. 3 where lens block 10 is shown bonded to the surface of integrated circuit chip 14 at which the photodetectors, not shown, are adjacent. A typical thickness between the surface of lens block 10 on which lenslet 11 are provided and the surface of lens block 10 bonded to chip 14 might be 20 mils. This thickness, of course, is related to the radius of lenslets 11 and the desired relation between the focal point of each lenslet and its corresponding photodetector in chip 14.

Thereafter, further components in the optical system can be provided which are supported by lens block 10 as may be convenient in the implementation of the optical system. A typical further component is an aperture means which has two parallel rows of holes therein corresponding to lenslets 11. With such an aperture means in place, each hole exposes therethrough a portion of a lenslet 11 permitting electromagnetic radiation to pass only through the exposed lenslet portions. Such an aperture means can be placed over lens block 10 resting against aperture standoff surfaces 12. Aperture post 13 can protrude through two major holes in the aperture means such that, after the aperture is in place, the structures 13 can be heated sufficiently to melt slightly and flow over some of the aperture means to hold the aperture means in place. Further components for an optical system can be mounted against this assembly of lens block 10 with such an aperture means such as further lens means if needed in the optical system.

To obtain lens blocks like lens block 10 in FIGS. 1 through 3, a mold must be provided which can be formed by first preparing a master surface. This is begun with providing a flat, clean substrate as the base for the master lens surface which base can be made from glasses, metals, ceramics or other suitable materials. In FIG. 4A undoped silicon has been chosen as the material for the base, 20, having an initial flat, clean surface, 21, for further processing.

To provide an etching mask, 5,000 to 8,000 Å of silicon dioxide is thermally grown on initial surface 21. Well known techniques of photolithography are used to provide openings in the thermal oxide such that the thermal oxide is left in those places on initial surface 21 of FIG. 4A where the aperture standoffs 12 of FIG. 1 are desired to occur. Then an etchant which attacks the underlying silicon substrate 20, but not the thermal oxide, is applied to the thermal oxide, and exposed surfaces of silicon substrate 20 sufficient to etch away the silicon to a depth of 12 $\mu$m. A typical etchant would be potassium hydroxide used in a mixture with equal parts of water. Afterward, the thermal oxide is removed to leave the structure as shown in FIG. 4B where the initial surface 21 after the etching has been redesignated 21'. The new surfaces which have been provided as a result of etching are designed 22 in FIG. 4B. Portions of the new surfaces which cannot be seen from the side view are indicated by a dashed line in FIG. 4B.

The constructing of a form for the master surface to provide portions of spheres required to form spherical surface lenslets is based on using a molten material. This molten material wets a limited surface such that the adhesive forces between the material and the surface and the surface tension of the molten material combine to produce the portion of a sphere form needed as a basis for a lenslet refracting body. Because of surface tension in the molten material, the molten material will take a shape such that the surface area thereof is minimized. Because the molten material will be chosen to wet the limited circular surface on which it is formed, the minimum surface area for a given volume of molten material will be that of a portion of a sphere.

To form the limited surface on which a molten material is to be provided as the basis for achieving the necessary shape for a lenslet, the structure shown in FIG. 4B has a new silicon dioxide layer, 23, thermally grown on surfaces 21' and 22 to a thickness of 5,000–8,000 Å as shown in FIG. 4C. The dashed lines of FIG. 4B have been omitted in FIG. 4C. On layer 23, there is deposited the material of which selected portions are to be wetted by a molten material in the process of forming the desired lenslet shape. A suitable material is aluminum deposited to a thickness of approximately 10,000 Å and such a deposition is designated layer 24 in FIG. 4C. The use of oxide layer 23 permits a convenient change in the choice of wetted surface materials at various locations which may not be as easy to make if the wetted surface material was put directly on the silicon surface 22 of silicon substrate 20. However, if the molten material is the same for forming the aperture post form as it is for the lenslets forms, so that a common wetted surface material can be used, the use of oxide layer 23 could be eliminated. Note that the thickness of oxide layer 23 and the thickness of aluminum layer 24 is greatly exaggerated relative to the thickness shown for lens block 20' for purposes of visual convenience.

To provide the desired pattern of circular disc portions of aluminum layer 24 as bases for the molten material to solidify upon in providing the forms for the lenslets and the aperture posts, standard photolithography techniques are used to provide circular disc shapes accurately having the diameter desired for lenslets and for aperture posts. A typical etchant for aluminum in this step is a solution of phosphoric acid, nitric acid, acetic acid and water. The result is shown in FIG. 4D where just a small portion of FIG. 4C is shown in cross-sectional view. The result of aluminum layer 24 having been patterned into circular disc bases is shown in part in FIG. 4D to the extent of there being present portions of two circular disc bases with each being designated 24'.

Since the molten material to be used in making the form for the lenslets and aperture posts will wet only aluminum bases 24' and not layer 23, the diameter of bases 24' control the extent of flow of such molten material for each of the lenslet forms or the aperture post form. Further, the location of each aluminum base 24' determines the location of the resulting lenslets or aperture posts in a molded block 10 of FIG. 1 and, as indicated above, the location must be accurate to within approximately 2 microns with respect to the photodetectors in the monolithic integrated circuit chip when block 10 is bonded to the chip.

The material which is to be put in a molten state to provide the form for the lenslets can be any material which properly wets the supporting circular disc base and which provides a finish suitable for an optical surface, that is a finish such that any irregularities in the surface are well less than a micron in any deviation from the basic curve of the resulting surface. A typical material is polymethylmethacrylate formed as a microbead. Such microbeads of a selected diameter are put one each on those bases 24' corresponding to lenslets 11 on FIG. 1, and a larger microbead put on those bases 24' corresponding to aperture posts 13.

Since lenslet to lenslet uniformity in curvature depends on the base 24' for each lenslet being well matched to one another and on the amount of material to be rendered in a molten state being well matched in amount on each base, the microbeads must be sorted so that only nearly identical sized microbeads are to be used. The selecting of microbeads from a supply thereof to achieve this can be done under a high magnification microscope, or by other methods, to see that the microbeads for placing on bases 24' corresponding to lenslets have diameters which vary from one to another by less than a micron. After carefully selecting such beads, they are placed on aluminum bases 24' as indicated above after the substrate with these bases has been heated to around 175° C. Bring the microbead in contact with a base 24' heated to such a temperature will cause the microbead to adhere thereto, i.e. to be "tacked down" until the entire arrangement, as shown in FIG. 4E, can be placed in an oven to cause the microbeads to become totally molten. Portions of two microbeads are shown in FIG. 4E and designated 25 there.

Thereafter, the arrangement of which part is shown in FIG. 4E is placed in an oven and heated to a higher temperature. If progress of the flow of the molten material is desired to be reviewed during the melting and subsequent flow, a somewhat higher temperature that is less than the finally reached temperature may be first used and the arrangement checked thereafter to see that the tacked beads have remained on their bases and begun to reflow. This need not be done, but rather the arrangement can be subjected to the final temperature for the desired period of time. A typical final temperature would be 230° C. with the arrangement subjected to this temperature for one hour.

At that point, the microbeads will have become entirely molten and flowed over the surface of the base on which each is located until the edges of the base are reached at which point the flow will go no further. Since there is such a flow, the microbeads initially need not be tacked to any particular part of the base 24' as the flow and surface tension will result in the form being spherical and centered. Upon removing the arrangement from the oven and permitting it to cool, the result is shown in FIG. 4F where the forms for the lenslets, 25', are in the shape of a partial sphere, i.e. the form suitable for a planar convex lens. The desired diameter for such lenslets have been achieved by having the molten material flow to the edge of the bases 24' which have the desired diameter.

Other possible ways for using surface tension to lead to a partial spherical shape might be to use photoresist on top of the silicon substrate with the photoresist having circular holes therein corresponding to the desired lenslet locations. A microbead inserted in each hole and permitted to reflow within that hole and over the top thereof will again through surface tension provide the desired shape. A modification of this method would be to add some kind of dam around each such photoresist hole to control the flow extent.

The master surface provided by the arrangement constructed through the preceding steps, that is the upper surface of the structure of which a portion is shown in FIG. 4F, is then used to form a mold. Gold is first evaporated on the master surface in preparation for nickel plating. Nickel is plated over the gold coated surface to a thickness of approximately a quarter of an inch. After this plating, the arrangement having the master surface is separated from the plated nickel mass, this latter nickel mass serving as a replication means. This nickel replication means can be used as a mold insert. Of course, further nickel replications may be needed for a multiple cavity mold, as spares, etc. These can be provided by well known methods.

The nickel replication means used as mold inserts are machined to fit into the mold and to provide for the desired thickness of the block means 10 in FIG. 1 depending on the separation desired between the lenslets 11 and the semiconductor chip photodetectors as may be suitable for the optical system design. The mold inserts are put into the molds and polymethylmethacrylate plastic lens are made through injection or transfer molding means which are well known. The result is shown in FIGS. 1 and 2 as block 10.

The embodiments of the invention in which an exclusive property or right is claimed are defined as follows:

1. An integrated circuit optical system, said system comprising:
   an electronic integrated circuit device having circuit components therein at least including optoelectronic transducers such that there is at least a plurality of said optoelectronic transducers adjacent a first side of said electronic integrated circuit device;
   a radiation transmitting material means having at least a plurality of lens portions integrally therein at a first side of said radiation transmitting material means such that electromagnetic radiation transmitted both through a second side of said radiation transmitting material means and through said lens portion is at least in part altered in direction of travel as a result of being transmitted through said lens portion, each said lens portion having an optical axis; and
   a bonding means, in addition to said electronic integrated circuit device and said radiation transmitting material means, bonding said radiation transmitting material means at said second side thereof to said integrated circuit device at said first side thereof such that said optical access of each said lens means is substantially centered with respect to a corresponding said optoelectronic transducer so that any deviation from being centered is less than approximately two micrometers.

2. The apparatus of claim 1 wherein said electronic integrated circuit device is a monolithic integrated circuit chip.

3. The apparatus of claim 1 wherein said bonding means is a substantially transparent adhesive located between said electronic integrated circuit device and said radiation transmitting material means, and which adheres to each.

4. The apparatus of claim 1 wherein said radiation transmitting material means also has integrally therein spacer means capable of maintaining another portion of said integrated circuit optical system at a selected distance from said lens portions.

5. The apparatus of claim 1 wherein said radiation transmitting material means also has integrally therein location means by which an aperture means can be properly located with respect to said lens portions.

6. The apparatus of claim 1 wherein said bonding means is a substantially transparent adhesive located between said electronic integrated circuit device and said radiation transmitting material means, and which adheres to each.

7. The apparatus of claim 1 wherein said radiation transmitting material means also has integrally therein spacer means capable of maintaining another portion of said integrated circuit optical system at a selected distance from said lens portions.

8. The apparatus of claim 1 wherein said radiation transmitting material means also has integrally therein location means by which an aperture means can be properly located with respect to said lens portions.

9. The apparatus of claim 4 wherein said radiation transmitting material means also has integrally thereon location means by which an aperture means can be properly located with respect to said lens portions.

10. A monolithic integrated circuit photodetector-optical system, said system comprising:
    a monolithic integrated circuit chip containing a plurality of kinds of circuit components including a plurality of photodetectors adjacent a major surface thereof;
    a lens means having a plurality of lens portions therein each having an optical axis and each capable of directing at least some of any electromagnetic radiation impinging thereon along an optical path such that said electromagnetic radiation reaches one of said photodetectors; and
    bonding means in addition to said monolithic integrated circuit chip and said lens means bonding said lens means to said monolithic integrated circuit chip such that said optical axis of each said lens means is substantially centered with respect to said photodetector in said optical path so that any deviation from being centered is less than approximately two micrometers.

11. The apparatus of claim 10 wherein said bonding means is a substantially transparent adhesive located between said major surface of said monolithic integrated circuit chip and said lens means, and which adheres to each.

12. The apparatus of claim 10 wherein said lens means also has integrally therein spacer means capable of maintaining another portion said monolithic integrated circuit photodetector-optical system at a selected distance from said lens portions.

13. The apparatus of claim 10 wherein said lens means also has integrally therein location means by which an aperture means can be properly located with respect to said lens portions.

14. Apparatus of claim 10 wherein said bonding means is a substantially transparent adhesive located between said major surface of said monolithic integrated circuit chip and said lens means, and which adheres to each.

15. The apparatus of claim 10 wherein said lens means also has integrally therein spacer means capable of maintaining another portion of said integrated circuit optical system at a selected distance from lens portions.

16. The apparatus of claim 10 wherein said lens means also has integrally therein location means by which an aperture means can be properly located with respect to said lens portions.

17. The apparatus of claim 12 wherein said lens means also has integrally therein location means by which an aperture means can be properly located with respect to said lens portions.

18. A method for providing a monolithic integrated circuit chip optical system, said method comprising:
fabricating a monolithic integrated circuit chip having a plurality of optoelectronic transducers therein adjacent a major surface of said monolithic integrated circuit chip;
forming a lens means having a plurality of lens portions therein each capable of directing at least some of any electromagnetic radiation impinging thereon along a selected optical path; and
joining said monolithic integrated circuit chip with said lens means by bonding said lens means to said major surface of said monolithic integrated circuit chip such that said directing of at least some of said electromagnetic radiation results in said electromagnetic radiation reaching said optoelectronic transducers, with said bonding being accomplished by use of a substantially transparent adhesive located between said lens means and said major surface of said monolithic integrated circuit chip which transparent adhesive reaches a desirable bonding strength substantially only through electromagnetic radiation impinging thereon.

19. The method of claim 18 wherein the said forming of said lens means is accomplished by molding said lens means through providing a lens means material in a mold where said mold has a surface of a shape desired for a portion of said lens means including said lens portions, said surface being in contact with said lens means material.

20. The method of claim 19 wherein said mold is provided by:
forming a substrate having a plurality of separated surfaces, each of a selected area and each of which comprises a material which is wetable by a primary molding material;
providing a selected quantity of at least one primary molding material on at least one of said separated surfaces to provide a prepared structure;
heating said prepared structure until said primary molding material flows to cover that separate surface upon which it was previously placed to provide a mold basis structure;
encasing at least that portion of said mold basis structure having said separate surfaces with said primary molding material thereon in an encasing material to serve as a replicating means; and
separating said mold basis structure and said replication means such that said mold may then be obtained from said replication means.

21. A method for forming a mold from which a molded optical body can be obtained, said molded optical body formed from a radiation transmitting material and having at least a plurality of lens portions integrally therein each having a surface portion which is substantially spherical such that electromagnetic radiation transmitted through a said lens portion is at least in part altered in direction of propagation, said method comprising:
forming a substrate having a plurality of separated surfaces, each of a selected area and each of which comprises a material which is wettable by a primary molding material;
providing a selected quantity of at least one primary molding material on at least one of said separated surfaces to provide a prepared structure;
heating said prepared structure until said primary molding material flows to cover that separate surface upon which it was previously placed to provide a mold basis structure;
encasing at least that portion of said mold basis structure having said separate surfaces with said primary molding material thereon in an encasing material to serve as a replicating means; and
separating said mold basis structure and said replication means such that a said mold may then be obtained from said replication means.

22. A lens block for mounting on a monolithic integrated circuit, said block comprising:
a base having a plurality of lens portions integrally thereon together formed of radiation transmitting material, said lens portions arranged along a major surface of said base with each lens portion having a surface opposite that on said base which is at least in part spherical with said base being of a selected thickness to thereby maintain a bottom surface of said base at a selected distance from said lens portions, and with said major surface of said base having location means thereon adjacent said lens portions by which an aperture means can be properly located with respect to said lens portions.

* * * * *